(12) United States Patent
Sato et al.

(10) Patent No.: US 8,953,894 B2
(45) Date of Patent: Feb. 10, 2015

(54) PATTERN MATCHING METHOD AND IMAGE PROCESSING DEVICE

(75) Inventors: Yoshimichi Sato, Hitachi (JP); Mitsuji Ikeda, Hitachinaka (JP); Fumihiro Sasajima, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 84 days.

(21) Appl. No.: 13/122,151

(22) PCT Filed: Oct. 2, 2009

(86) PCT No.: PCT/JP2009/067226
§ 371 (c)(1),
(2), (4) Date: Jun. 27, 2011

(87) PCT Pub. No.: WO2010/038859
PCT Pub. Date: Apr. 8, 2010

(65) Prior Publication Data
US 2011/0262043 A1   Oct. 27, 2011

(30) Foreign Application Priority Data
Oct. 3, 2008   (JP) ................................ 2008-257940

(51) Int. Cl.
G06K 9/00 (2006.01)
G06K 9/62 (2006.01)
H01J 37/28 (2006.01)
G06T 7/00 (2006.01)
H01J 37/22 (2006.01)

(52) U.S. Cl.
CPC ............ *H01J 37/28* (2013.01); *G06K 9/00127* (2013.01); *G06T 7/0044* (2013.01); *H01J 37/222* (2013.01); *G06K 2209/403* (2013.01); *G06T 2207/10061* (2013.01); *G06T 2207/30148* (2013.01); *H01J 2237/24592* (2013.01)
USPC ............ 382/209; 382/145; 382/151; 382/152

(58) Field of Classification Search
None
See application file for complete search history.

(56) References Cited

U.S. PATENT DOCUMENTS

| 2001/0048478 | A1* | 12/2001 | Taoka ............................ 348/308 |
| 2003/0173516 | A1* | 9/2003 | Takane et al. .................. 250/310 |
| 2004/0131246 | A1* | 7/2004 | Ikeda et al. .................... 382/145 |
| 2004/0217288 | A1* | 11/2004 | Sasajima et al. .............. 250/310 |

(Continued)

FOREIGN PATENT DOCUMENTS

| JP | 2001-084944 A | 3/2001 |
| JP | 2005-061837 A | 3/2005 |

(Continued)

*Primary Examiner* — Stephen R Koziol
*Assistant Examiner* — Jonathan S Lee
(74) *Attorney, Agent, or Firm* — Miles & Stockbridge P.C.

(57) ABSTRACT

A pattern matching method for a scanning electron microscope comprises a step of performing pattern matching of only an upper layer pattern between an image (101) in which a pattern consisting of plural layers is represented and a template (104) in which the upper layer pattern of the plural layer pattern is selectively represented, thereby identifying the position of the pattern consisting of the plural layers. Then, information about the upper layer pattern is subtracted from the image (101), thus extracting shape information (108) about the lower layer pattern. Consequently, stable positioning or selective information extraction on a certain layer is enabled regardless of the state of the depths of a pattern formed in three dimensions or of the charge state of a sample.

12 Claims, 7 Drawing Sheets

(56) References Cited

U.S. PATENT DOCUMENTS

| | | | |
|---|---|---|---|
| 2005/0045821 A1* | 3/2005 | Noji et al. | 250/311 |
| 2005/0086618 A1* | 4/2005 | Ito et al. | 716/4 |
| 2005/0087686 A1 | 4/2005 | Honda et al. | |
| 2005/0194535 A1* | 9/2005 | Noji et al. | 250/311 |
| 2006/0193508 A1* | 8/2006 | Sutani et al. | 382/145 |
| 2006/0288325 A1* | 12/2006 | Miyamoto et al. | 716/19 |
| 2007/0023653 A1* | 2/2007 | Toyoda et al. | 250/310 |
| 2007/0092129 A1* | 4/2007 | Sugiyama et al. | 382/145 |
| 2007/0098248 A1 | 5/2007 | Toyoda et al. | |
| 2007/0098249 A1* | 5/2007 | Miyano et al. | 382/145 |
| 2008/0032429 A1* | 2/2008 | Chen et al. | 438/14 |
| 2008/0138916 A1* | 6/2008 | Mitsui | 438/16 |
| 2009/0039263 A1* | 2/2009 | Matsuoka et al. | 250/311 |
| 2009/0084954 A1* | 4/2009 | Ezumi et al. | 250/307 |
| 2009/0152463 A1* | 6/2009 | Toyoda et al. | 250/311 |
| 2009/0238443 A1* | 9/2009 | Sato et al. | 382/145 |
| 2012/0207397 A1* | 8/2012 | Nagatomo et al. | 382/218 |

FOREIGN PATENT DOCUMENTS

| | | |
|---|---|---|
| JP | 2005-114398 A | 4/2005 |
| JP | 2007-121147 A | 5/2007 |

\* cited by examiner

FIG.1

UPPER-LEVEL TEMPLATE

LOWER-LEVEL TEMPLATE

| | IMAGE | SETTING 1 | SETTING 2 |
|---|---|---|---|
| 301   A | | NORMAL MEASUREMENT | NORMAL MEASUREMENT |
| 302   B | | · WARNING INFORMATION<br>· MEASUREMENT BETWEEN UPPER-LEVEL LAYER AND LOWER-LEVEL LAYER | · ERROR INFORMATION<br>· END OF MEASUREMENT OPERATION |
| 303   C | | · WARNING INFORMATION<br>· MEASUREMENT VALUE 0 | · ERROR INFORMATION<br>· END OF MEASUREMENT OPERATION |

304 — SETTING 1 column
305 — SETTING 2 column

PATTERN MATCHING METHOD AND IMAGE PROCESSING DEVICE

TECHNICAL FIELD

The present invention relates to a pattern matching method and device and, more particularly, to a method of matching for a pattern formed over plural layers and to a device implementing the matching.

BACKGROUND ART

In semiconductor device fabrication steps, thin-film patterns formed on semiconductor wafers have been made finer with larger scales of integration. It is more important to automate process monitoring for accurate, high-speed processing, in order to inspect whether or not the patterns are formed on the wafers as designed.

From the past, scanning electron microscopes (SEMs) have been used as equipment for measuring the dimensions of minute patterns.

SEMs include equipment known as CD (critical-dimension)-SEM, and in this kind of equipment positioning is performed while relying on pattern matching when patterns on semiconductor wafers or masks placed on stages (sample stages) are measured.

The pattern matching method is a technique of causing a template representing a unique pattern formed on a sample to search within a given image region, to identify locations having high degrees of match with the template. Since a relative positional relationship between a pattern identified by the pattern matching and a pattern subjected to a measurement is previously known, it is possible to quickly perform positioning relative to the minute pattern subjected to the measurement. Furthermore, in some cases, subjects of measurement themselves are taken as matching patterns.

In Patent Literature 1, a pattern matching apparatus has been proposed that is designed to perform pattern matching in which a hole pattern is subjected to pattern matching and in which design data about a semiconductor pattern is taken as a template.

CITATION LIST

Patent Literature

Patent Literature 1: JP-A-2007-121147 (corresponding to US 2007/0098248)

SUMMARY OF INVENTION

Technical Problem

In recent years, patterns have been made with larger scales of integration. Concomitantly, semiconductor devices have tended to have multilayer structures or three-dimensional structures. Following further miniaturization, contact holes or the like formed in devices have become deeper. Whether holes have been properly formed is an important item of measurement.

On the other hand, in pattern matching, a proper degree of match is required between an SEM image subjected to matching and a template. However, with respect to a pattern of holes or the like spanning plural layers, a composite shape of its upper and lower portions is a pattern shape represented on an SEM image and so its pattern deformations have more variations than planar patterns. Especially, the lower portions of hole patterns are deformed to a larger extent. In addition, the orbit of electrons emitted from the bottoms of the holes is affected by electric charge adhering to the sample surface (electrification). The yield of the detected secondary electrons may be varied.

If the formed image is varied by the efficiency at which secondary electrons are detected or if the degree of deformation of the pattern increases, the rate of success of matching decreases. As a result, there is the anxiety that the measurement accuracy decreases, for example, based on measurement of a wrong part or the throughput deteriorates based on the inability to identify a desired measurement part. In the technique disclosed in Patent Literature 1, a method that is excellent as a pattern matching method using design data is explained but the technique is not proposed in such a way that deformation of the bottom of a hole pattern or a variation in the efficiency at which secondary electrons are detected is taken as a problem to be solved.

A method for the purpose of achieving stable positioning or selective information extraction on a certain layer regardless of the circumstances of the depths of a pattern formed in three dimensions or of the circumstances of charging of a sample and a device for achieving the purpose are hereinafter described.

Solution to Problem

To achieve the above-described purpose, a method of performing first pattern matching on image information representing plural layers by the use of a first template selectively representing the shape of an upper portion of a pattern is proposed, as well as a device. Furthermore, in order to perform selective extraction on a certain layer, a method of subtracting information about the shape of the upper portion of the pattern from the image information representing the plural layers or from the shape information is proposed, as well as a device.

Advantageous Effects of Invention

The above-described structure makes it possible to perform pattern matching at a quite high success rate regardless of variations in information obtained from the lower portion of the pattern. Furthermore, selective extraction of a pattern in a lower-level layer is enabled.

Other objects, features, and advantages of the present invention will become apparent from the following description of embodiments of the invention with respect to the accompanying drawings.

DESCRIPTION OF EMBODIMENTS

Nowadays, it has become more important to measure and inspect multilayer semiconductor devices but the following undesired phenomena occasionally appear when measurement positions are determined using pattern matching.

Fundamentally, pattern matching is a technique for searching for a coincident pattern portion, which may vary in size and shape. Therefore, pattern matching needs to be carried out based on the premise that the subject pattern portion deforms. If the positioning accuracy in pattern matching is insufficient, correct measurement values are not obtained. In the worst case, there is the possibility that totally erroneous positions are measured.

Especially, where a multilayer structure or a three-dimensional structure is subjected to pattern matching, variable factors of pattern appear across plural layers. Pattern deformation variations are combinations of pattern deformations in each layer. Especially, in contact holes or the like, contact hole bottom surfaces may be more deformed than contact hole front surfaces. Combinations of such variations of deformations of contact hole bottoms and variations of deformations of contact hole front surfaces result in variations of deformations of SEM images of contact holes where pattern front surface and bottom portions are represented in a combined manner.

In order to cope with many kinds of pattern deformations, it is conceivable to prepare many templates for pattern matching, the templates being different in pattern size, shape, and others, but the number of the previously prepared templates is exorbitant. Furthermore, there is the anxiety that the matching processing time will be prolonged.

A pattern matching method capable of accomplishing higher speeds of matching processing while attaining high matching accuracy even if the pattern is a composite pattern consisting of patterns present in plural layers is hereinafter described, as well as a device for implementing the pattern matching.

A summary of description using the drawings is as follows.

(1) A pattern matching method comprising the steps of performing first pattern matching on an image representing a pattern whose constituent parts are present across plural layers (heights) using a first template in which an upper portion of the pattern is selectively represented; and subtracting information about the upper portion of the pattern from an image of a region including a pattern identified by the first template or performing second pattern matching using a second template in which a lower portion of the pattern is represented.

(2) The pattern matching method in which, when the second pattern matching is performed, the second template from which information about a pattern represented in the first pattern has been subtracted is used.

(3) The pattern matching method in which the first template is derived from an SEM image for which no preliminary charging scanning has been done.

(4) The pattern matching method in which the second template is derived from an SEM image for which preliminary charging scanning has been done.

(5) The pattern matching method in which, when the first pattern matching is performed, an SEM image is derived under the condition where no preliminary charging scanning is done.

(6) The pattern matching method in which, when the second pattern matching is performed, an SEM image is derived under the condition where preliminary charging scanning has been done.

(7) The pattern matching method in which a decision is made as to whether or not a measurement is performed according to the degree of overlap between upper and lower portions of a pattern whose constitutive parts are present across plural layers (heights).

(8) The pattern matching method in which a subsequent method of measurement or the like is set according to the degree of overlap between the upper and lower portions of a pattern whose constitutive parts are present across plural layers (heights).

The pattern matching method as described above and the device for implementing it make it possible to extract the shape of each hierarchical level if the size and shape of the pattern and the degree of overlap vary. Also, the accuracy of the measurement position can be enhanced. Besides, when the degree of overlap is large, it is possible to make a selection and setting as to how the measurement processing should be performed and how a report of the circumstances should be made.

Figure 4:
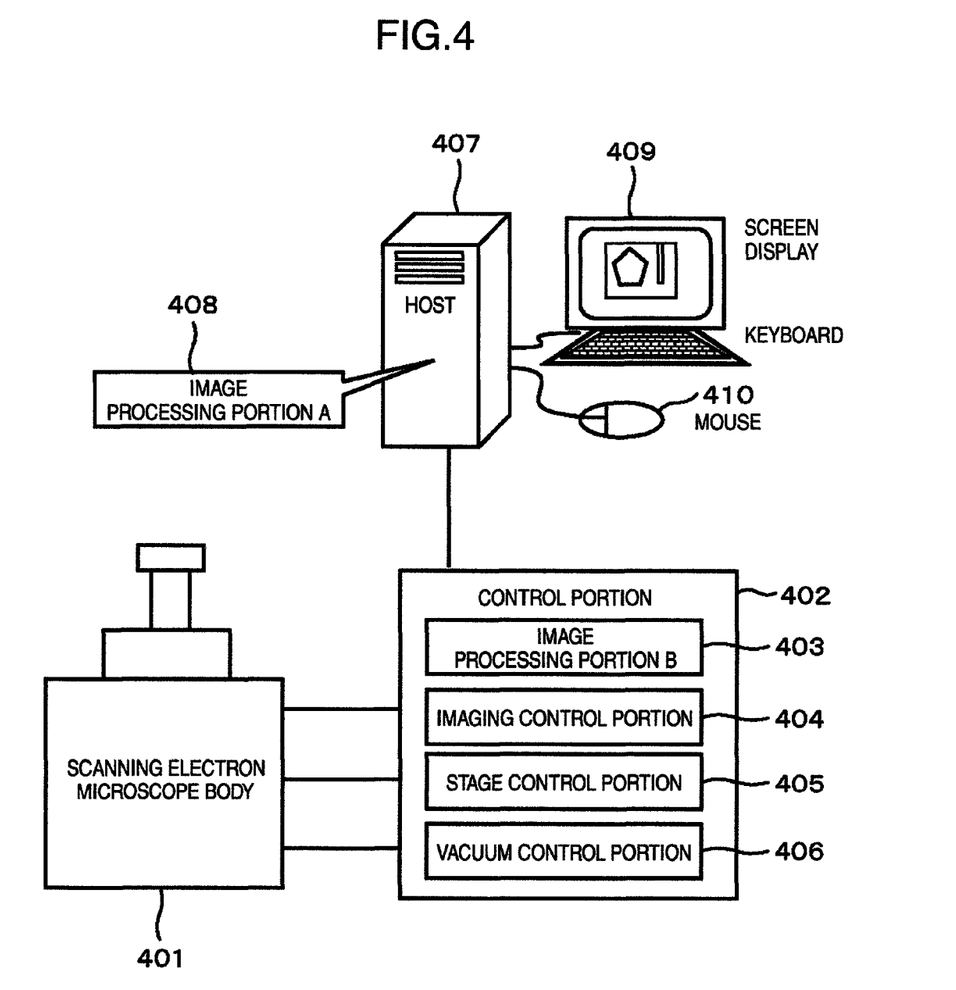
FIG. 4 is a diagram schematically illustrating an SEM system.

FIG. 4 is a diagram schematically illustrating an SEM that is one kind of charged-particle beam apparatus. The SEM described in the present embodiment is principally provided with a scanning electron microscope body 401, a control portion 402, a host (processor) 407, a screen display device 409, and a mouse (pointing device) 410 which are connected as shown.

The control portion 402 is equipped with an image processing portion B 403, an imaging control portion 404, a stage control portion 405, and a vacuum control portion 406. A program for providing control by these control portions is registered. The imaging control portion 404 provides control for obtaining SEM images from the scanning electron microscope body 401.

The stage control portion 405 is intended to control movement of a stage (sample stage) within the scanning electron microscope body 401.

The vacuum control portion 406 controls an exhaust vacuum pump within the scanning electron microscope body 401. The image processing portion B 403 enters SEM images from the imaging control portion 404 and processes them. The host 407 has an image processing portion A 408.

Image processing including many steps checked by a human operator is mainly performed by the image processing portion A (408), while image processing that needs to be performed continuously at high speed is chiefly done by the image processing portion B 403 because it takes much time cost to transfer image information between the control portion 402 and the host 407.

Processing for registering templates offered to the pattern matching described hereinafter is carried out by the image processing portion A 408 of the host 407. SEM images are either transferred from the control portion or stored in a storage device within the host. Design data is stored in a storage device within the host. Screen images are output to the screen display device 409. The operator performs arbitrary manipulations on the screen images using the mouse 410.

Matching processing and shape extraction processing also described hereinafter is similarly carried out by the image processing portion A 408 of the host 407. However, where the processing capability of the host processor or the image transfer rate from the control portion is considered to be low, the processing is carried out by the image processing portion B 403 according to the need.

The measurement position accuracy can be enhanced by applying the following algorithm if the device is any instrument (not limited to microscopy apparatus) having the objective of performing automatic measurements based on image information. Furthermore, if the device is not connected with any apparatus for acquiring images in practice, the following algorithm can be utilized provided that the device is in an environment where images can be processed.

Figure 5:
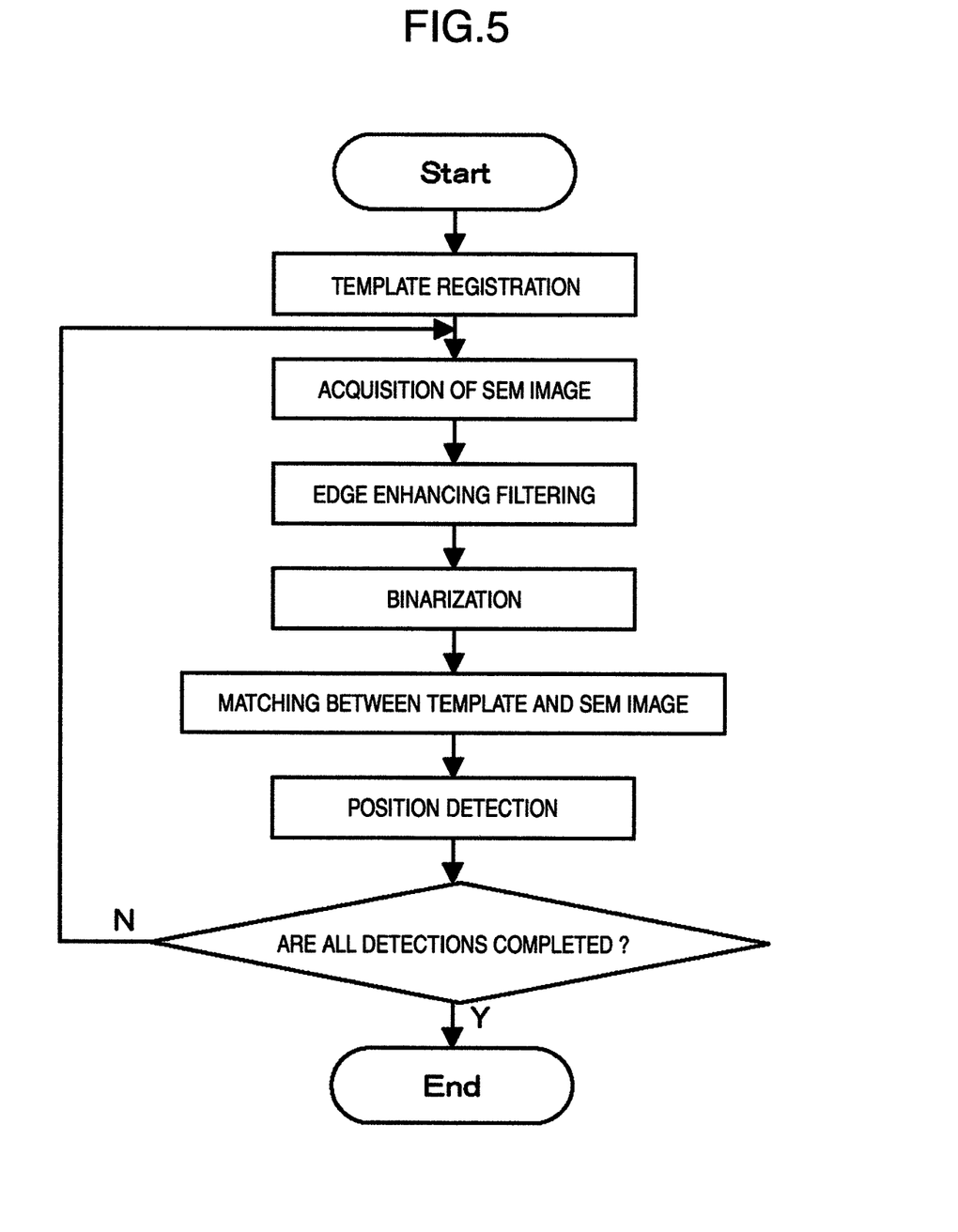
FIG. 5 is a chart illustrating one example of template matching processing.
Figure 6:
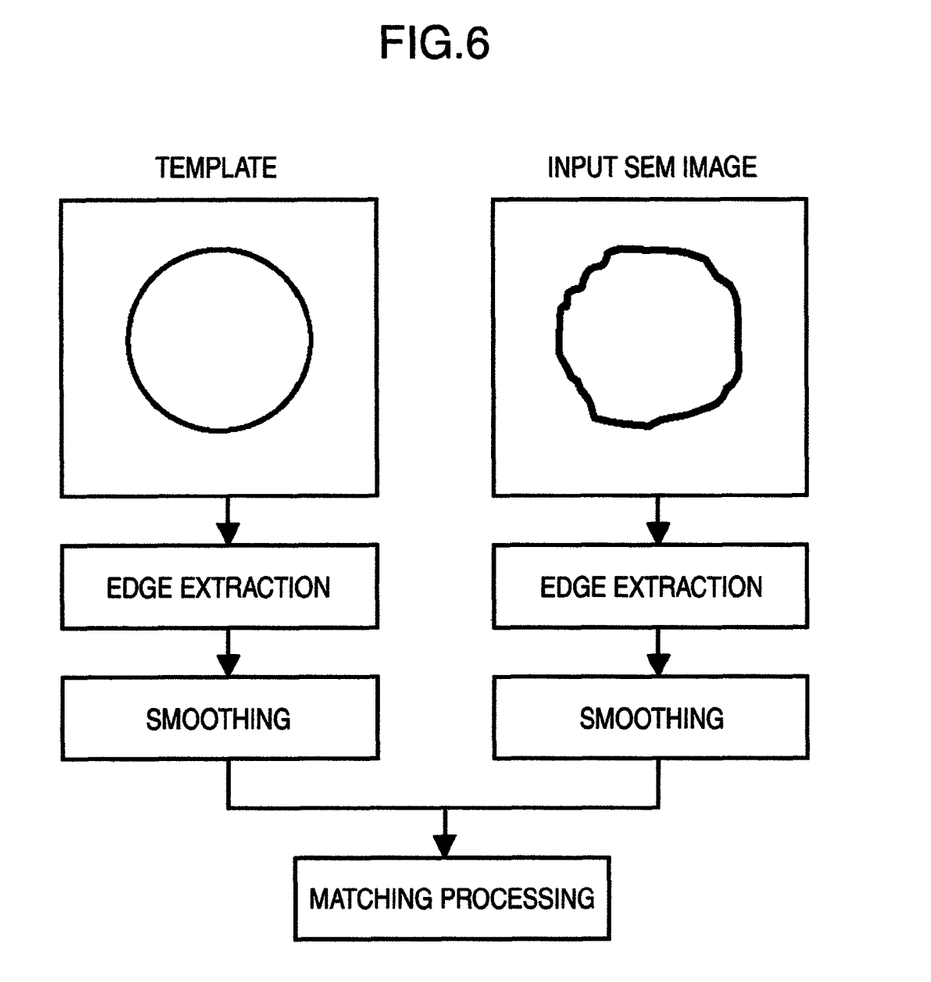
FIG. 6 is a diagram illustrating one example of pattern matching processing.

FIG. 5 is a chart illustrating one example of template matching processing. In the present matching processing, the obtained SEM image is edge enhanced and then binarized, followed by execution of matching processing. FIG. 6 is a diagram illustrating another example of template matching processing. In this processing, edge extraction processing is performed on the template and SEM image and then smoothing is done. By intentionally blurring the edges in this way, the difference in shape between the edges of the template and SEM image is interpolated. As a result, the rate of success of the matching can be enhanced. Especially, where the template is created based on design data, the difference in shape between the edges of the template and SEM image is great and, therefore, this technique is effective. It is to be noted that the examples of processing shown in FIGS. 5 and 6 merely show exemplary examples and that various other pattern matching methods can be applied.

Embodiment 1

Figure 1:
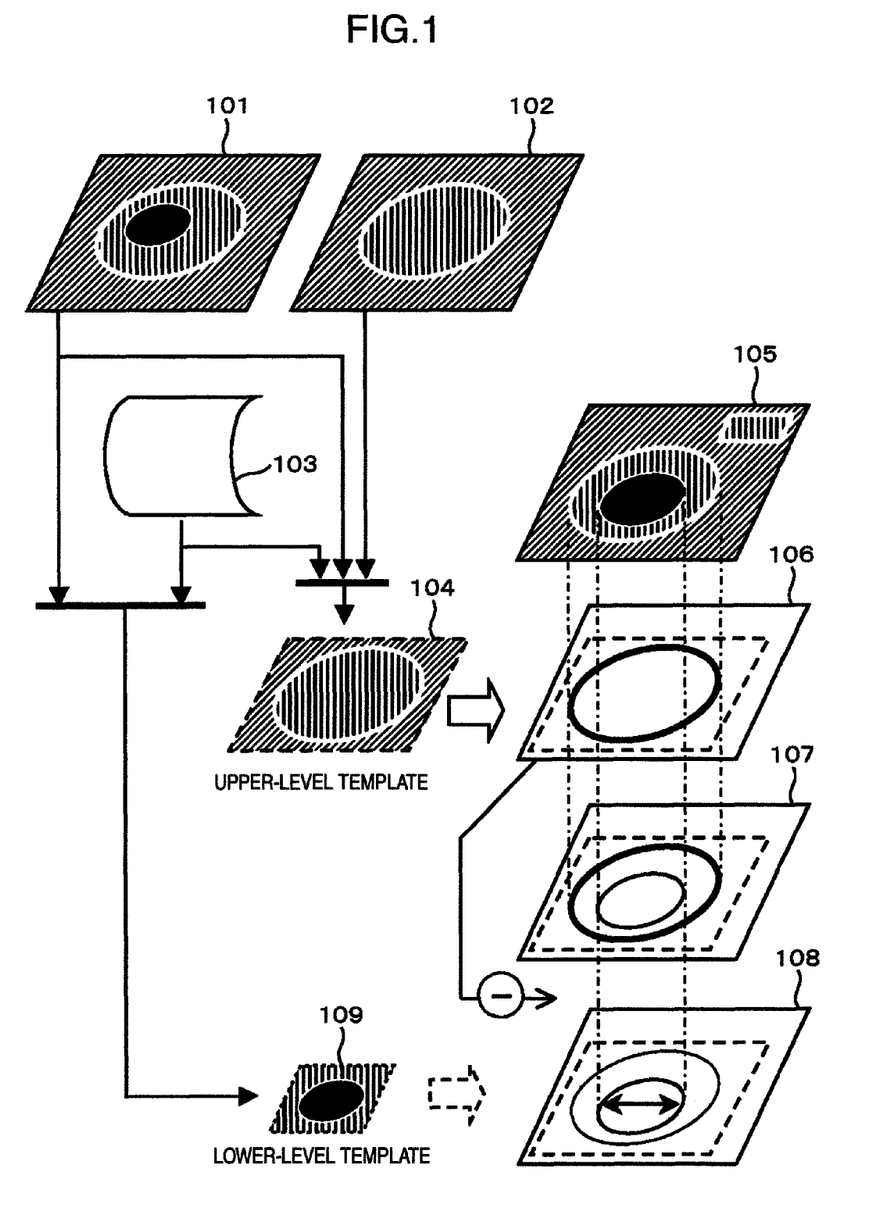
FIG. 1 is a view illustrating one example of processing for extracting shapes of a lower portion of a pattern, based on pattern matching using a template selectively representing an upper portion of the pattern.

FIG. 1 is a view illustrating pattern matching using templates and one example of step of extracting shapes of a lower layer pattern. An object of the present embodiment is to recognize and measure a deep-bottom pattern that is viewed as a lower-level layer in a semiconductor pattern with round holes (hole pattern). The deep-bottom pattern that is viewed as the lower-level layer varies greatly especially in shape, size, and position. The step shown in FIG. 1 pertains to a technique for stably performing positioning relying on template matching even if the deformation of shape of the contact hole bottom portions (or intermediate layer) or the like is great.

First, pattern information providing fundamental templates is prepared. In some cases, the templates are created based on actual SEM images. In other cases, the templates are created based on design data about semiconductor devices.

In the former case, an image 101 representing both a hole bottom (a lower portion of a pattern) and a hole surface (an upper portion of the pattern) and an image 102 selectively representing the hole surface are prepared.

The image 101 was obtained under the condition where the sample surface was positively charged. The image 102 was acquired under the condition where the sample surface was not positively charged. The pre-dose technique is available as one method of positively charging sample surfaces. The pre-dose is a method of preliminary charging consisting of performing beam scanning so as to charge a sample surface before an image for measurement or inspection is obtained. More specifically, the sample surface is positively charged by scanning a beam having a secondary electron emission efficiency (electrons emitted from the sample/electrons incident on the sample) δ exceeding 1 over the sample (i.e., the condition where exiting electrons are larger in number than electrons incident on the sample).

When the beam for forming an image is scanned after the preliminary charging as described so far has been performed, electrons produced at the hole bottom are pulled toward positive charges on the surface of the sample. Therefore, the electrons produced at the hole bottom can be captured at high efficiency. The image 101 is an image obtained in such a manner.

On the other hand, the image 102 is an image formed as a result of execution of beam scanning for the formation of the image under the condition where electrons emitted from the hole bottom cannot ascend to the sample surface. In particular, it is conceivable to obtain an image prior to execution of preliminary charging. Furthermore, in a case where charging is induced in any situation or in a case where the hole is shallow and electrons released from hole bottom are guided to the sample surface without inducing charging, an image selectively representing the hole surface can be acquired by scanning the sample with a beam (such as a beam having a secondary electron emission efficiency of less than 1) inducing negative charge opposite to positive charge and then obtaining an image.

An upper-level template 104 selectively representing an upper portion of a pattern and a lower-level template 109 selectively representing a lower portion of the pattern are formed from the image obtained as described so far. The upper-level template 104 is a part or the whole of the image 102, and is formed by selecting an image where the contour of the upper part of the hole appears. In the case of the present example, information about the hole bottom might be a cause hindering a decision on the degree of match in matching. Therefore, where the hole bottom is displayed on the image, processing is performed in such a way that the hole bottom is masked or information about the portion corresponding to the hole bottom is selectively lost. Besides, only the image portion representing the upper portion of the hole may be selectively applied to an algorithm for computing the degree of match.

The lower-level template 109 is formed by selecting the portion of the image 101 which represents the pattern bottom portion (by removing the portion where the upper portion of the pattern appears from the image data).

On the other hand, in the case of the latter example where templates are formed based on design data, information about the upper and lower portions of the pattern is previously stored in the design data 103. Therefore, necessary information is extracted from a GDS file or the like where the design data is stored, and what are imaged two-dimensionally from the information can be applied in place of the images 101 and 102 or of the upper-level template 104 and lower-level template 109 without performing preliminary charging.

The following matching processing is performed after at least two templates are created as described so far.

First, pattern matching of only the upper layer is performed using the upper-level template 104, and its position and shape are extracted. Shape information 106 about the upper layer pattern is obtained by performing pattern matching using the upper-level template 104 on the image 105 and selectively extracting the upper layer pattern.

The pattern matching of only the upper layer can be performed without being affected by variations in the lower-level pattern by masking the inside of the pattern or performing such processing that portions having shape or edge features matching the upper-level template are selectively subjected to matching as described previously.

Then, a shape extraction is performed on all the layers within the range where the pattern positions have been detected. Multilayer shape (geometric) information 107 indicates the state in which shape detection on the other layer is done within the range (e.g., a region of the same size as the upper-level template 104) identified by the upper-level template 104. Position error and processing speed deterioration can be prevented by restricting the detection range to the region identified by the upper-level template in this way.

Then, shape information 108 about the lower layer pattern is extracted. This processing is achieved by subtracting the shape information 106 about the upper layer pattern from the multilayer shape information 107. Alternatively, the lower-level template 109 may be prepared and portions of identical features may be extracted but this is limited to when variations are not so large. The lower-level template 109 can be prepared by specifying and extracting those portions from the image 101 or from the design data 103.

If a deep, bottom pattern shape which seems as a lower-level layer is extracted and identified as described so far, it is unlikely that the measurement position is in error even in the case where the shape, size, or position varies greatly.

Embodiment 2

Figure 7:
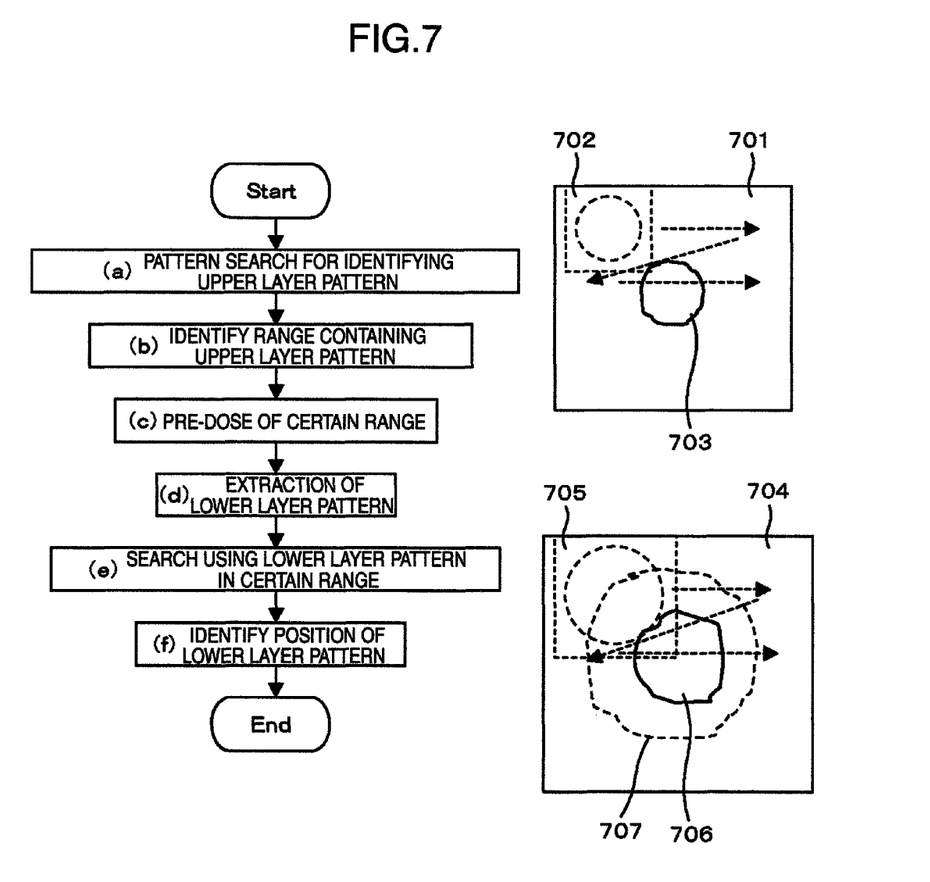
FIG. 7 is a diagram illustrating one example of two-stage matching for an upper layer pattern and a lower layer pattern.

FIG. 7 is a flowchart illustrating other example of processing of the above-described two-stage matching. In the present embodiment, a pattern search is carried out using an upper layer pattern template 702 to identify an upper layer pattern 703 displayed within an upper layer pattern search region 701 (step (a)). Since the position of the upper layer pattern 703 is identified by the step (a), a search range for extracting a lower layer pattern is determined based on the positional information (step (b)). In the step (b), a region narrower than the upper layer pattern search region 701 is set as the search range 704 for the lower layer pattern utilizing the positional information about the upper layer pattern. Although the size of the search region for the lower layer pattern can be set at will, it is desired that the region be narrower than the upper layer pattern search region 701 and wider than a lower layer pattern template 705 prepared for the lower layer pattern.

A pre-dose of the upper layer pattern region surrounding the lower layer pattern 706 is then is carried out by electron-beam scanning (step (c)). The pre-dose is a technique for extracting electrons released from the bottoms of deep holes (lower layer) by positively charging the sample surface (upper layer) and so it is necessary that the electron beam be scanned relative to the sample surface region surrounding the bottoms of the deep holes. If the pre-dose is done, the amount of electrons released from the bottoms of the deep holes and drawn out to the sample surface increases dramatically. Consequently, on the image of a pattern search region 704 of the lower layer, the lower layer pattern 706 is emphasized (step (d)).

Within the pattern search region 704 of the lower layer in which the lower layer pattern has been emphasized as described so far, a pattern search is effected (step (e)) using the lower layer pattern template 705 to identify the position of the lower layer pattern (step (f)). The rate of success of matching can be enhanced further by deleting the edge portion 707 of the upper layer pattern displayed on the lower layer pattern template by means of image processing where necessary.

Furthermore, the process of the pre-dose is not always necessary. However, accurate matching processing can be accomplished because matching processing can be performed based on images where the upper and lower layers are respectively enhanced by using images taken respectively before and after a pre-dose in two-stage matching.

Embodiment 3

Figure 2:
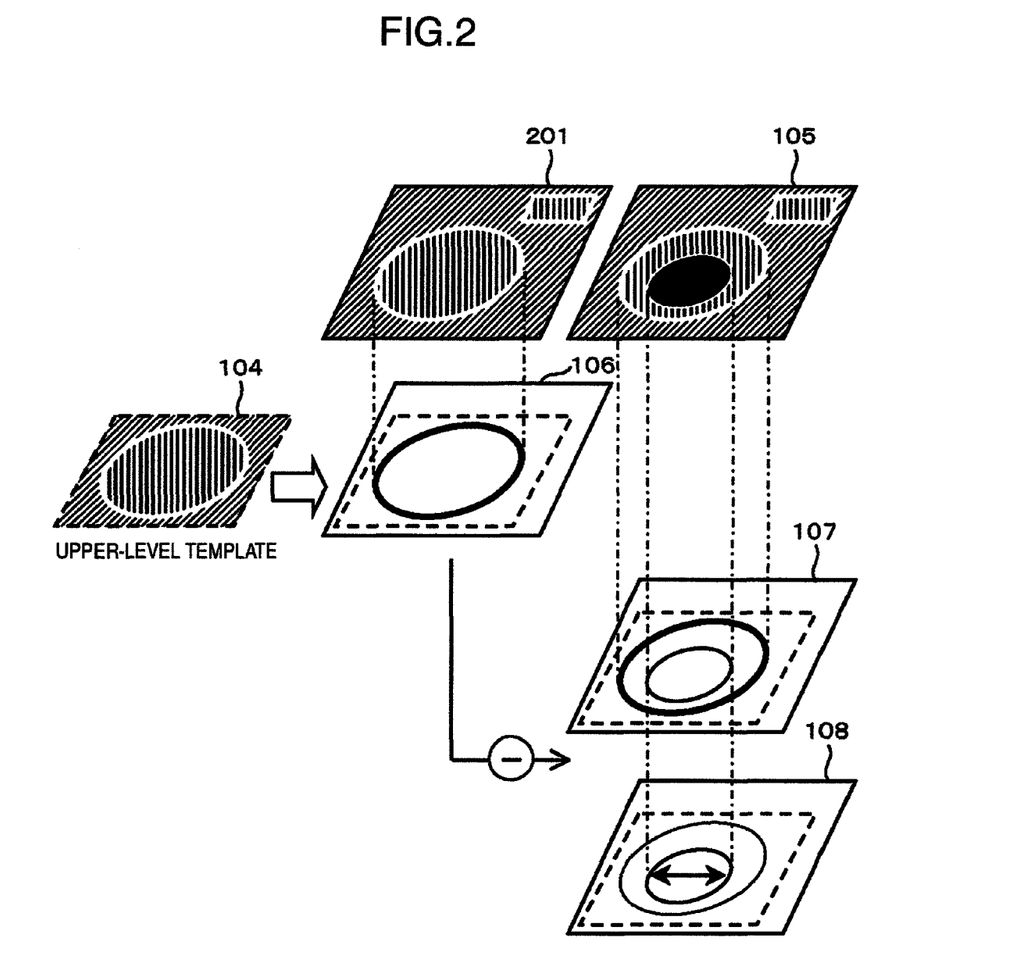
FIG. 2 is a view illustrating another example of processing for extracting shapes of a lower portion of a pattern, based on pattern matching using a template selectively representing an upper portion of the pattern.

FIG. 2 is a view illustrating another example of steps of pattern matching using templates. The example of steps shown in FIG. 2 is similar to Embodiment 1. However, in Embodiment 1, it is assumed that it is difficult to discriminate features in the upper and lower layers on the image 105 obtained by imaging a subject of inspection to be measured because they resemble or that it is difficult to make matching with the upper-level template 104 if information about the upper and lower layers is mixed because variations in the upper layer are large.

Image information 201 has been obtained by imaging a pattern of only the upper-level layer of a subject of inspection to be measured. Matching with the upper-level template 104 is made using the image information 201, and position detection and shape extraction are performed. Shape extraction on every layer is effected with the separately obtained image 105. In the case of the present example, shape extraction about the upper and lower layers is done, and the multilayer shape (geometric) information 107 is obtained. The shape information 108 about the lower layer pattern is extracted by subtracting the shape information 106 about the upper layer pattern from the multilayer shape information 107.

Embodiment 4

An example of error handling in a case where the lower-level layer of a contact hole pattern is automatically measured is hereinafter described. Where an automatic measurement of a pattern is made in CD-SEM, if the measurement is made on the assumption that there is given information though the given information is not obtained on the image, the measurement is carried out on an object despite it is different from the subject of measurement. Consequently, the reliability of the measurement results is in danger of deteriorating. In the present example, a method which, when given information is not obtained, is capable of selectively extracting only reliable information by issuing a warning to that effect or terminating the measurement and a device are described.

Figure 3:
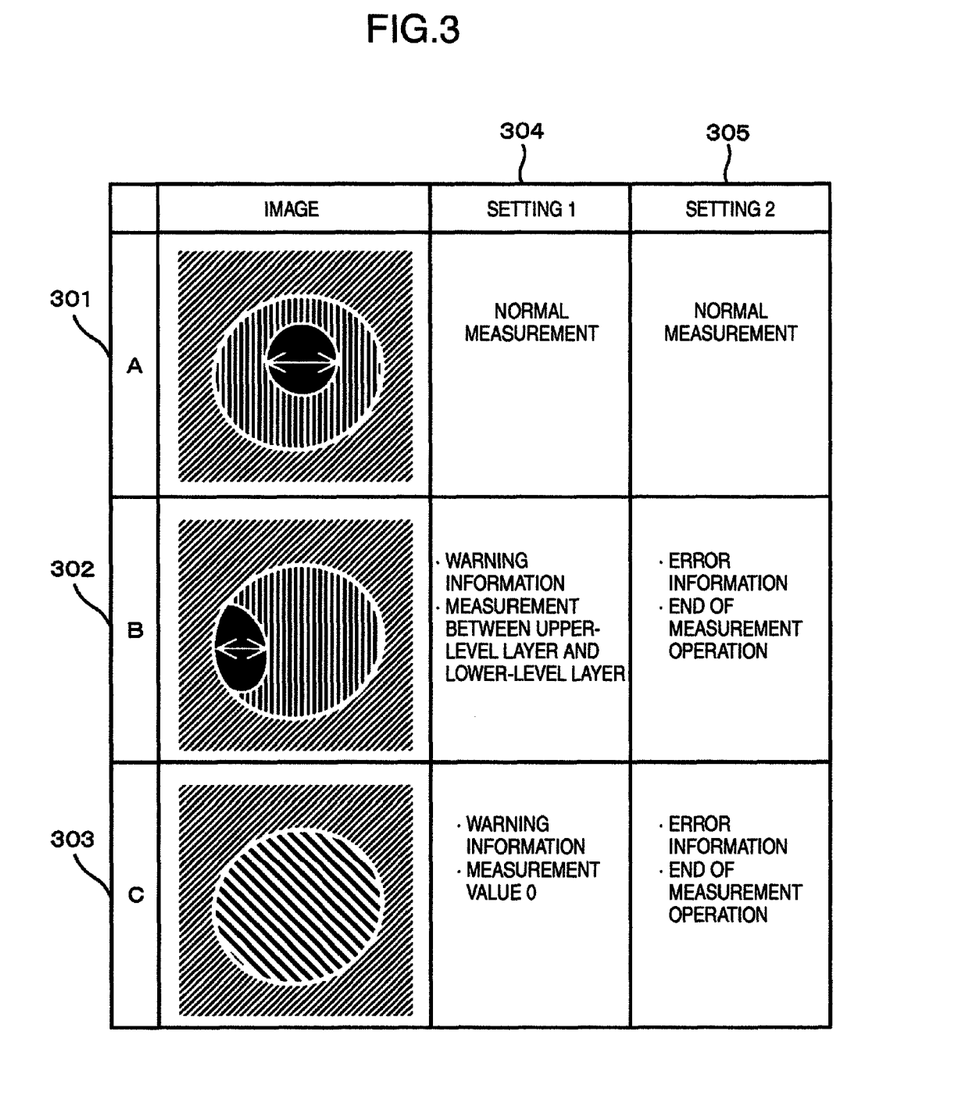
FIG. 3 is a diagram illustrating an example of correspondence when measurement processing is varied according to the kind of obtained image.

FIG. 3 is a diagram illustrating an example of correspondence when measurement processing is varied according to the kind of obtained image.

A case A 301 is a case where a deep-bottom pattern which is viewed as a lower-level layer is seen without overlapping with an upper-level layer. A position to be measured (indicated by an arrow in the figure) can be uniquely determined. In this case, measurements can be made without any particular problems. Therefore, a normal measurement of the lower layer pattern is carried out.

A case B 302 is a case where a deep-bottom pattern which is viewed as a lower-level layer appears in contact or overlapping with an upper-level layer.

In the instance of such cases, if the pattern width of the lower layer is measured, the measurement is between the upper and lower layers. Where such a subject of measurement is measured, setting 1 is selected. Where a measurement of such a subject of measurement is not desired, setting 2 is selected to generate error information, for terminating the measurement operation.

A case C 303 is a case where the deep-bottom pattern which should be viewed as a lower-level layer is not seen at all.

Also, in this case, the setting can be selected between setting 1 in which measurement value zero is output and a warning is issued and setting 2 in which error information is generated and the measurement operation is ended. Thus, it is possible to obtain measurement results fulfilling user's intention.

In the above embodiment, in the method of registering a measuring position and positioning templates, the accuracy may be enhanced by making templates automatically displayed at first rest on information registered in the past (such as by learning). Furthermore, in modifying the effective positions of templates, any arbitrary position may be specified rather than preset positions. In addition, in pattern matching of similar structures, it may be possible to cope with deformation of the subject of measurement robustly by imparting a likelihood to the positional relationship between the similarities. Further, the operator may set the likelihood with a parameter.

The above description has been provided concerning embodiments. The present invention is not limited to them. It is obvious for those skilled in the art that various changes and modifications may be made within the spirit of the present invention and the scopes of the accompanying claims.

REFERENCE SIGNS LIST

401: scanning electron microscope body
402: control portion
403: image processing portion B
404: imaging control portion
405: stage control portion
406: vacuum control portion
407: host
408: image processing portion A
409: screen display device
410: mouse

The invention claimed is:

1. A pattern matching method for performing pattern matching between a pattern on an image obtained by a scanning electron microscope and a registered template, the method comprising:
performing first pattern matching on image information representing the pattern, including a plurality of layers, within a first search range using a first template in which an upper layer of the pattern is included;
specifying a second search range narrower than the first search range; and
after positively charging the upper layer of the pattern, performing second pattern matching within the second search range using a second template, in which a lower layer of the pattern is included, to identify a position of the pattern.

2. The pattern matching method of claim 1, wherein information about said upper layer is subtracted from image information obtained based on said identification of the position.

3. The pattern matching method of claim 1, wherein the second pattern matching is performed between image information obtained based on said identification of the position and the template in which a lower layer of the pattern of the plural layers is selectively represented, to identify pattern position of the lower layer.

4. The pattern matching method of claim 3, wherein template subjected to said second pattern matching is formed by preliminary scanning of an electron beam relative to a sample based on an image obtained when a top surface of the sample, including the upper layer, is positively charged.

5. The pattern matching method of claim 1, wherein the image information representing the pattern consisting of said plural layers is formed by preliminary scanning of an electron beam relative to said sample based on an image obtained when a top surface of the sample, including the upper layer, is positively charged.

6. An image processing device for performing pattern matching between a pattern on an image obtained by a scanning electron microscope and a registered template, said image processing device being operable to:
perform first pattern matching on image information representing the pattern, including a plurality of layers, within a first search range using a first template in which an upper layer of the pattern is included;
specify a second search range narrower than the first search range; and
after positively charging the upper layer of the pattern, perform second pattern matching within the second search range using a second template, in which a lower layer of the pattern is included, to identify a position of the pattern.

7. The image processing device of claim 6, wherein information about said upper layer is subtracted from image information obtained based on said identification of the position.

8. The image processing device of claim 6, wherein the second pattern matching is performed between image information obtained based on said identification of the position and the template in which a lower layer of the pattern of the plural layers is selectively represented, to identify a pattern position of the lower layer.

9. The image processing device of claim 8, wherein the template subjected to said second pattern matching is formed by preliminary scanning of an electron beam relative to a sample based on an image obtained when a top surface of the sample, including the upper layer, is positively charged.

10. The image processing device of claim 6, wherein the image information representing the pattern consisting of said plural layers is formed by preliminary scanning of an electron beam relative to said sample based on an image obtained when a top surface of the sample, including the upper layer, is positively charged.

11. The pattern matching method of claim 1, wherein the second search range is wider than the second template.

12. The image processing device of claim 6, wherein the second search range is wider than the second template.

* * * * *